United States Patent [19]

Maeguchi et al.

[11] 4,447,823

[45] May 8, 1984

[54] SOS P—N JUNCTION DEVICE WITH A THICK OXIDE WIRING INSULATION LAYER

[75] Inventors: Kenji Maeguchi; Hiroyuki Tango, both of Yokohama, Japan

[73] Assignee: Tokyo Shibaura Denki Kabushiki Kaisha, Japan

[21] Appl. No.: 240,850

[22] Filed: Mar. 5, 1981

[30] Foreign Application Priority Data

Mar. 12, 1980 [JP] Japan .................................. 55-31291

[51] Int. Cl.³ ..................... H01L 29/78; H01L 27/02; H01L 27/12; H01L 45/00
[52] U.S. Cl. ........................................ 357/23; 357/41; 357/42; 357/49; 357/51; 357/4
[58] Field of Search .......... 357/23 R, 23 VT, 23 TF, 357/23 D, 41, 49, 42, 51, 23 CS, 4

[56] References Cited

U.S. PATENT DOCUMENTS

| 4,087,902 | 5/1978 | Feltner | 357/23 TF |
| 4,169,746 | 10/1979 | Ipri et al. | 357/49 |
| 4,253,162 | 2/1981 | Hollingsworth | 357/23 TF |
| 4,320,312 | 3/1982 | Walker et al. | 357/23 R |
| 4,395,726 | 7/1983 | Maeguchi | 357/23 TF |

FOREIGN PATENT DOCUMENTS

| 27278 | 3/1978 | Japan | 357/23 F |
| 54-130883 | 10/1979 | Japan | 357/23 TF |

OTHER PUBLICATIONS

ISSCC 74, "High Density Static ESFI MOS Memory Cells,", by Karl Goser, Michael Pomper and Jeno Tihanyi.
Abbas et al. *IBM Tech. Disc. Bull.*, vol. 16, No. 3, Aug. 1973, "Silicon–On Sapphire . . . ", pp. 1027–1029.

*Primary Examiner*—Martin H. Edlow
*Assistant Examiner*—Jerome Jackson
*Attorney, Agent, or Firm*—Finnegan, Henderson, Farabow, Garrett & Dunner

[57] ABSTRACT

A semiconductor device having silicon-on-sapphire structure in which a pn junction element is formed in a silicon substrate disposed on a sapphire plate. An oxide layer is formed in the surface area of the p-type region which serves to form the pn junction elements.

13 Claims, 12 Drawing Figures

PRIOR ART

SOS P—N JUNCTION DEVICE WITH A THICK OXIDE WIRING INSULATION LAYER

BACKGROUND OF THE INVENTION

The present invention relates to a semiconductor device having a silicon semiconductor structure formed on an insulation substrate and a method for manufacturing the same.

High integration of MOS type semiconductor devices has progressed recently to develop a MOS LSI having extremely minute semiconductor elements which are 2 $\mu$m in minimum dimension. Particularly, a MOS LSI memory having such large scale memory capacity as 16K-bit and 64k-bit has been developed and practiced. It has recently become common in view of high integration and low power consumption that one memory cell is formed as an enhancement transisotr-resistor type (E/R type) structure in which high resistance elements are used as load elements, instead of a 6-transistor structure in which one memory cell is formed by six MOS transistors. FIG. 1 shows a circuit diagram of a memory cell of E/R type. The memory cell includes enhancement type drive MOS transistors 2 and 4 whose sources are grounded, load resistors 6 and 8 connected respectively between a power supply terminal $V_D$ and drains of MOS transistors 2, 4, an enhancement type transfer MOS transistor 10, with one end of the current path of which is connected to the drain of MOS transistor 2 and to the gate of MOS transistor 4, and an enhancement type transfer MOS transistor 12, with one end of the current path of which is connected to the gate of MOS transistor 2 and to the drain of MOS transistor 4. The other ends of the current paths of MOS transistors 10 and 12 are connected to bit lines BL1 and BL2, respectively while their gates are both connected to a word line WL.

Load resistors 6 and 8 usually employed in the E/R type memory cell are formed from polycrystalline silicon so as to have high resistance values ranging from 1 M$\Omega$ to 100 m$\Omega$. When resistance elements having such high resistance values are made of polycrystalline silicon, some problems are caused in that the resistance value of such resistance elements varies depending on the crystallographic property of the polycrystalline silicon (such as the radius of crystal particles) and depending on the difference of growth condition. Moreover, the formation of ohmic contact between high resistance polycrystalline silicon regions and conductive regions is difficult. Ohmic contact can be attained by making high the impurity concentration in a region adjacent to contacted areas. However, impurities in the high impurity concentration region abnormally diffuse (along the boundaries of the crystal particles, for example) into a low impurity concentration region, thus causing the resistance value of the high resistance region to be lowered.

There has been considered another memory cell of 4-transistor-2-diode type in which diodes 14 and 16 are used as load elements, as shown in FIG. 2, instead of load resistors 6 and 8. In order to set the reverse resistance value of diodes 14 and 16 to a several tens M$\Omega$ or more, it is necessary that the reverse current density of these diodes be set over several nA/$\mu$m. However, it is difficult to gain such property from these diodes using the usual silicon substrate. In addition, diodes formed using a silicon substrate need a larger area as compared with load resistors formed of polycrystalline silicon.

SUMMARY OF THE INVENTION

An object of the present invention is to provide a semiconductor device having pn junction regions whose electric properties render these regions suitable for use as load elements in the memory cell, and a method of manufacturing such a semiconductor device.

According to one embodiment of the present invention, a semiconductor device is provided comprising an insulation body, a silicon layer formed on the insulation body, a first semiconductor region of one conductivity type formed in part of a silicon layer extending from the surface of the silicon layer to the insulation body, and a second semiconductor region of conductivity type opposite to that of the first semiconductor region, the second semiconductor region being formed in a region adjacent to the first semiconductor region and cooperating with the first semiconductor region to form a pn junction element.

The pn junction element of this semiconductor device includes p-type and n-type regions formed on the insulation layer so that the p-type and n-type regions may be formed with a bad crystallinity, thus enabling reverse current to be made large. In addition, the insulation layer is formed thick in the surface area of one of the p-type and n-type regions which form the pn junction element, thus making it possible to form a wiring layer on the insulation layer and to enhance the integration density of elements.

DETAILED DESCRIPTION OF THE PREFERRED EMBODIMENT

Figure 1:
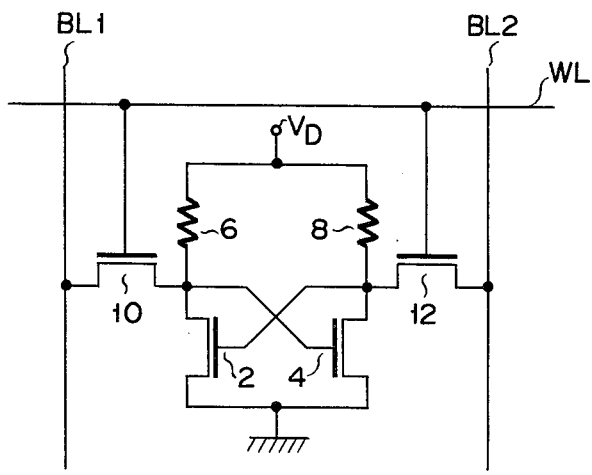
FIGS. 1 and 2 are circuit diagrams showing conventional memory cells.
Figure 2:
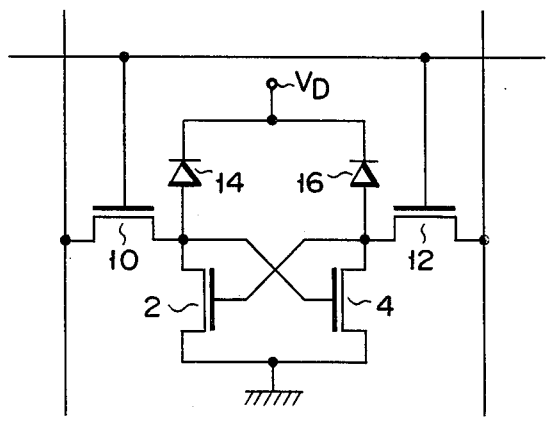
Figure 3A:
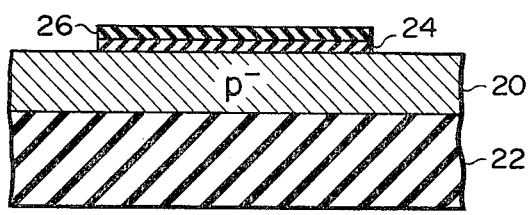
FIGS. 3A through 3F show a process of making a semiconductor device according to one embodiment of this invention which includes a pn junction element which can be used in the memory cell shown in FIG. 2.

FIGS. 3A through 3F show a process of making a semiconductor device which includes a pn junction element which is effectively used as a diode 14 or 16 for the memory cell shown in FIG. 2. As shown in FIG. 3A, silicon is deposited on the surface of an insulating or sapphire substrate 22 to form a p-type silicon layer 20 whose thickness is about 0.8 $\mu$m. A silicon dioxide (SiO$_2$) film 24 having a thickness of about 1,000 Å is formed on the surface of the silicon layer 20 and a silicon nitride (Si$_3$N$_4$) film 26 having a thickness of about 1,000 Å is further formed on the surface of SiO$_2$ film 24. SiO$_2$ and Si$_3$N$_4$ films 24 and 26 are then selectively removed to leave a predetermined element region.

Figure 3B:
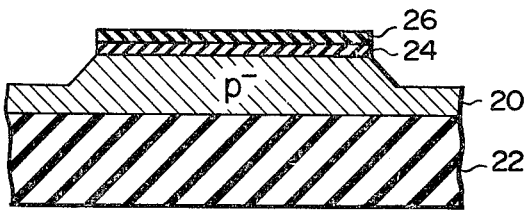

As shown in FIG. 3B, the silicon layer 20 not present under the element region is etched to a depth of about 4,000 Å (or to have a thickness half the original one).

Figure 3C:
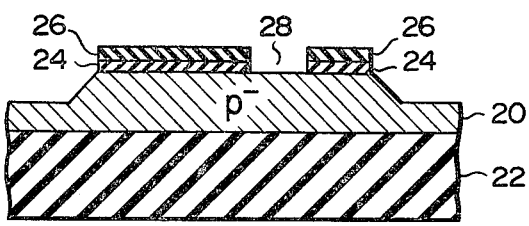
Figure 3D:
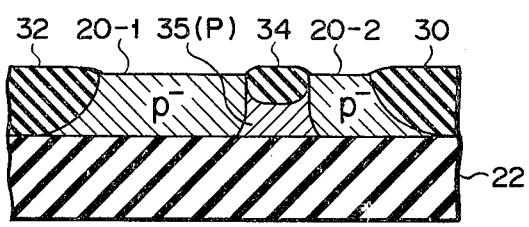

As shown in FIG. 3C, SiO$_2$ and Si$_3$N$_4$ films 24 and 26 are further selectively etched to form a hole or gap 28 dividing the respective SiO$_2$ and Si$_3$N$_4$ films 24 and 26 into two portions. Thereafter, p-type impurity such as boron, for example, is injected through the hole 28 into the silicon layer 20 in a concentration of $5 \times 10^{11}$ atoms/cm$^2$ using ion-injection technique and an injection voltage of 50 KeV. The exposed surface of the semiconductor substrate thus formed is wet-oxidized at a temperature of 1,000° C. to form oxide layers 30, 32 and 34 as shown in FIG. 3D. This oxidizing step is continued until oxide layers 30 and 32 reach the sapphire substrate 22. The p-type silicon layer 20 in the element region is therefore separated from other regions by these SiO$_2$ layers 30 and 32. The SiO$_2$ layer 34 is so formed that the distance between the under surface of the layer 34 and the upper surface of the insulation body 22 may be made about 4,000 Å. Boron impurity ion-injected into the silicon layer 20 during the preceding step is annealed in the oxidizing step to form a p-type region 35 under the oxide layer 34, and the p-type region 35 cooperates with the SiO$_2$ layer 34 to divide the silicon layer 20 into two regions 20-1 and 20-2. SiO$_2$ and Si$_3$N$_4$ films 24 and 26 are removed by etching after the oxidizing step.

Using the usual silicon gate MOS process, a gate region 36 including the SiO$_2$ film of 1,000 Å and a polycrystalline silicon layer formed on the SiO$_2$ film is formed on part of the surface of silicon layer 20-1 while a wiring layer 38 of polycrystalline silicon is formed on the SiO$_2$ film 34. A phosphosilicate glass (PSG) layer (not shown) is then formed on the surface of thus formed semiconductor structure and phosphorus in the glass layer is diffused into the p-type silicon layer 20 at a temperature of about 1,000° C. The PSG layer is then removed by etching. Therefore, n$^+$-type regions 40 and 42 which serve as source and drain of a MOS transistor are formed in the silicon layer 20-1, and the silicon layer 20-2 is transformed to an n$^+$-type region 44 which cooperates with the p-type region 35 to form a pn junction element.

Figure 3E:
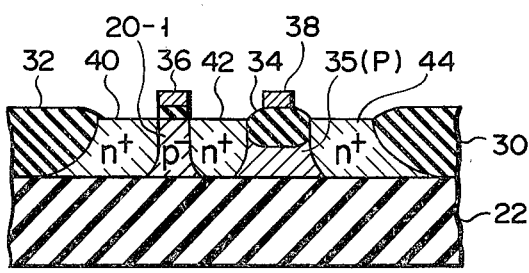
Figure 3F:
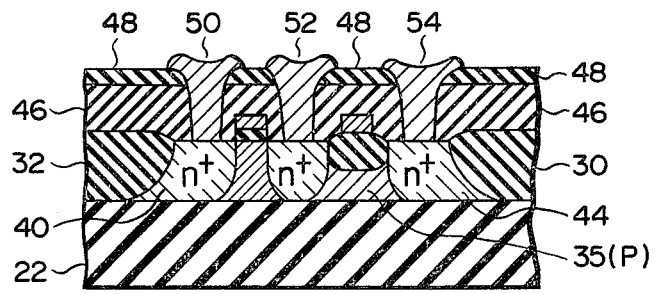

When the semiconductor structure shown in FIG. 3E is formed as described above, SiO$_2$ layer 46 and PSG layer 48 are successively deposited, as shown in FIG. 3F, on SiO$_2$ layers 30, 32, 34 and gate region 36 by the CVD method. Thereafter, SiO$_2$ layer 46 and PSG layer 48 are selectively removed by etching to partially expose surfaces of n$^+$-type regions 40, 42 and 44. Aluminum is then vapor-deposited on the exposed portions of n$^+$-type regions 40, 42 and 44, and PSG layer 48, and an aluminum layer thus formed is selectively removed by etching to form electrode patterns 50, 52 and 54 relative to the n$^+$-type regions 40, 42 and 44.

Figure 4:
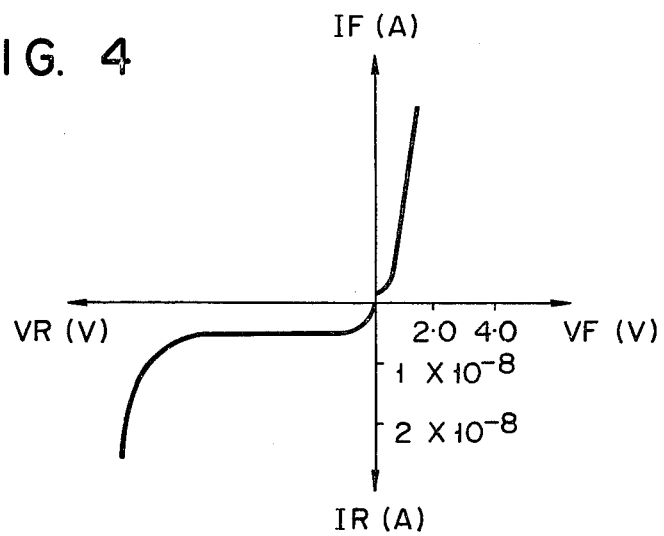
FIG. 4 shows the electrical property of the pn junction element shown in FIG. 3F.

As apparent from the semiconductor device shown in FIG. 3F, for example, the pn junction element capable of being used as the diode 14 or 16 for the memory shown in FIG. 2 is formed of p-type region 35 and n$^+$-type region 44. This pn junction element is formed in this case to have a width of 5 μm and a thickness of 4,000 Å, for example. FIG. 4 shows voltage and current characteristics of pn junction device thus obtained.

As apparent from voltage and current characteristics shown in FIG. 4, reverse current IR of $5 \times 10^{-9}$ A flows through the diode when a reverse voltage VR of 5 V is applied to this diode. The diode having these IR-VR characteristics can be effectively used as the diode 14 or 16 in the memory cell shown in FIG. 2. In this diode, forward current IF exponentially increases in accordance with a forward voltage VF of higher than 0.5 V, showing the usual diode forward characteristic. In the case of pn junction device formed on the insulating substrate such as of silicon-on-sapphire (SOS) type, a diode having such a large reverse current can be obtained since generation and recombination currents are large.

As clearly shown in FIGS. 3E and 3F, the SiO$_2$ layer 34 can be formed thick enough on the p-type layer 35 enabling the wiring layer 38 to be formed on the SiO$_2$ layer 34 enhancing the integration density of the elements.

Figure 5:
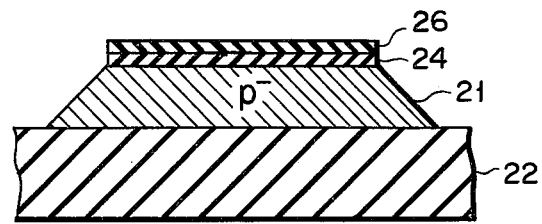
FIG. 5 is a modification of the semiconductor structure shown in FIG. 3B.

Though the present invention has been described with reference to one embodiment, it should be understood that the present invention is not limited to that one embodiment. As shown in FIG. 3B, for example, the silicon layer 20 not present under the element region is removed by etching to the thickness of 4,000 Å in the embodiment, but an island region 21 of silicon may be formed, as shown in FIG. 5, by completely removing that part of the silicon layer 20 which is not present in the element region. Thereafter, the same steps as those used in the aforementioned embodiment may be carried out to manufacture a semiconductor device which has the same effect as that of the semiconductor device explained with reference to FIGS. 3A to 3F.

Figure 6:
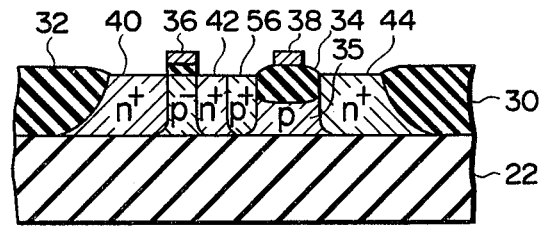
FIGS. 6 and 7 show modifications of the semiconductor structure shown in FIG. 3E.
Figure 7:
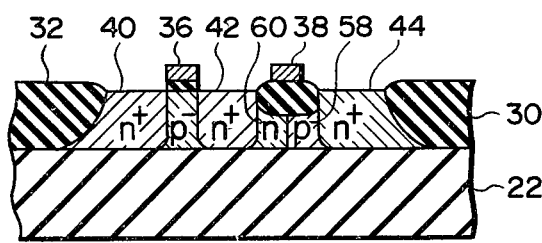

The p-type region 35 is formed adjacent to the n$^+$-type region 42 in the embodiment, as shown in FIG. 3E, by doping part of silicon layer 20 with boron using the ion injection technique, but a p$^+$-type region 56, which serves as an electrode region, may be formed, as shown in FIG. 6, in the n$^+$-type region 42 adjacent to the p-type region 35 using the usual CMOS process. Boron is doped by the ion injection method to form the p-type region 35 in the above-described embodiment, but boron and phosphorus may be doped instead by the ion injection method into their corresponding regions, as shown in FIG. 7, to form a p-type region 58, which cooperates with the n$^+$-type region 44 to form the pn junction element, as well as an n-type region 60 between the p-type region 58 and the n$^+$-type region 42.

It is not necessarily required that the regions 44 and 56 are formed at high impurity concentration, but they may be formed of n-type and p-type regions, respectively.

The p$^-$-type silicon layer 20 is used in the embodiment, but an n$^-$-type silicon layer may be used instead with conductivity types of other regions reversed, thus enabling the same effect as that attained by the embodiment to be achieved.

Polycrystalline silicon is used in the embodiment to form gate electrode and wiring layer, but high-melting-poing metal such as molybdenum and tungsten may be used instead. It may be silicide such as molybdenum silicide, tungsten silicide, titanic silicide and tantalic silicide, or aluminum.

What is claimed is:

1. A semiconductor device comprising:
   an insulation body;
   a silicon layer formed on the insulation body;
   a first semiconductor region of a first conductivity type formed in a part of the silicon layer;
   a second semiconductor region formed in a part of said silicon layer adjacent to the first semiconductor region and cooperating with the first semiconductor region to form a pn junction element, said second semiconductor region having a second conductivity type opposite to that of the first semiconductor region, and said first semiconductor region having an upper surface lying below the upper surface of said silicon layer;

a third semiconductor region of first conductivity type formed in a part of said silicon layer separated from the second semiconductor region and adjacent to the first semiconductor region and having a higher impurity concentration than that of the first semiconductor region; and an insulation region formed at least on said upper surface of the first semiconductor region with the bottom of said insulation region lying below the upper surface of said silicon layer.

2. A semiconductor device according to claim 1 further including a fourth semiconductor region of second conductivity type formed in a part of said silicon layer separated from the second semiconductor region and adjacent to the third semiconductor region, a fifth semiconductor region of second conductivity type formed in a part of said silicon layer separated from the fourth semiconductor region, and a gate region insulatively laid over between the fourth and fifth semiconductor regions.

3. A semiconductor device according to claim 2, wherein the silicon layer is formed in a limited area on said insulation body.

4. A semiconductor device according to claim 1, 2, or 3 further including an insulating layer which encloses the silicon layer and defines an island area of silicon.

5. A semiconductor device comprising:
an insulation body;
a silicon layer formed on the insulation body;
a first semiconductor region of a first conductivity type formed in a part of the silicon layer;
a second semiconductor region formed in a part of said silicon layer adjacent to the first semiconductor region and cooperating with the first semiconductor region to form a pn junction element, said second semiconductor region having a second conductivity type opposite to that of the first semiconductor region, and said first semiconductor region having an upper surface lying below the upper surface of said silicon layer;
a third semiconductor region of second conductivity type formed in a part of said silicon layer separated from the second semiconductor region and adjacent to the first semiconductor region, a fourth semiconductor region of second conductivity type formed in a part of said silicon layer separated from the third semiconductor region, and a gate region insulatively laid over between the third and fourth semiconductor region; and
an insulation region formed at least on said upper surface of the first semiconductor region with the bottom of said insulation region lying below the upper surface of said silicon layer.

6. A semiconductor device according to claim 5 wherein the insulation region is also formed at least in the surface area of the third semiconductor region.

7. A semiconductor device comprising:
an insulation body;
a silicon layer formed on the insulation body;
a first semiconductor region of a first conductivity type formed in a part of the silicon layer;
a second semiconductor region formed in a part of said silicon layer adjacent to the first semiconductor region and cooperating with the first semiconductor region to form a pn junction element, said second semiconductor region having a second conductivity type opposite to that of the first semiconductor region, and said first semiconductor region having an upper surface lying below the upper surface of said silicon layer;
a third semiconductor region of second conductivity type formed in a part of said silicon layer separated from the second semiconductor region and adjacent to the first semiconductor region;
a fourth semiconductor region of second conductivity type formed in a part of said silicon layer separated from the second semiconductor region and adjacent to the third semiconductor region, a fifth semiconductor region of second conductivity type formed in a part of said silicon layer separated from the fourth semiconductor region, and a gate region insulatively laid over between the fourth and fifth semiconductor regions; and
an insulation region formed at least on said upper surface of the first semiconductor region with the bottom of said insulation region lying below the upper surface of said silicon layer.

8. A semiconductor device according to claim 7 further including a conductive layer formed on the insulation region.

9. A semiconductor device according to claim 7 wherein the first semiconductor region is formed to reach the insulation body.

10. A semiconductor device according to claim 5 further including a conductive layer formed on the insulation region.

11. A semiconductor device according to claim 5 wherein the first semiconductor region is formed to reach the insulation body.

12. A semiconductor device according to claim 1, 2, or 6 further including a conductive layer formed on the insulation region.

13. A semiconductor device according to claim 1, 2, or 6 wherein the first semiconductor region is formed to reach the insulation body.

* * * * *

UNITED STATES PATENT AND TRADEMARK OFFICE
CERTIFICATE OF CORRECTION

PATENT NO. : 4,447,823
DATED : May 8, 1984
INVENTOR(S) : KENJI MAEGUCHI ET AL.

It is certified that error appears in the above—identified patent and that said Letters Patent is hereby corrected as shown below:

Claim 3, column 5, line 21, change "claim 2" to --claim 1, 2 or 5--.

Claim 4, column 5, lines 24 and 25, change "claim 1, 2, or 3" to --claim 1, 2, or 5--.

Claim 6, column 6, line 1, change "claim 5" to --claim 7--.

Signed and Sealed this

Twenty-second Day of January 1985

[SEAL]

Attest:

DONALD J. QUIGG

Attesting Officer     Acting Commissioner of Patents and Trademarks